United States Patent
Oosterlaken et al.

(10) Patent No.: US 6,902,395 B2
(45) Date of Patent: Jun. 7, 2005

(54) MULTILEVEL PEDESTAL FOR FURNACE

(75) Inventors: Theodorus Gerardus Maria Oosterlaken, Oudewater (NL); Frank Huussen, Bilthoven (NL); Timothy Robert Landsmeer, Utrecht (NL); Herbert Terhorst, Amersfoort (NL)

(73) Assignee: ASM International, N.V., Bilthoven (NL)

( * ) Notice: Subject to any disclaimer, the term of this patent is extended or adjusted under 35 U.S.C. 154(b) by 239 days.

(21) Appl. No.: 10/390,505

(22) Filed: Mar. 13, 2003

(65) Prior Publication Data

US 2003/0175649 A1 Sep. 18, 2003

Related U.S. Application Data

(60) Provisional application No. 60/365,129, filed on Mar. 15, 2002.

(51) Int. Cl.[7] .................................................. F27D 5/00
(52) U.S. Cl. ......................... 432/241; 432/5; 432/253; 392/418
(58) Field of Search ............................ 432/5, 6, 152, 432/241, 250, 253, 205; 219/390, 392; 392/416, 418; 414/172; 373/128, 130

(56) References Cited

U.S. PATENT DOCUMENTS

| | | | | |
|---|---|---|---|---|
| 5,252,062 A | * | 10/1993 | Groves et al. | 432/205 |
| 5,308,955 A | * | 5/1994 | Watanabe | 219/390 |
| 5,329,095 A | * | 7/1994 | Okase | 219/390 |
| 5,601,428 A | | 2/1997 | Okoshi et al. | |
| 5,662,470 A | * | 9/1997 | Huussen et al. | 432/241 |
| 5,755,570 A | * | 5/1998 | Shinde et al. | 432/253 |
| 5,846,073 A | * | 12/1998 | Weaver | 432/241 |
| 6,191,388 B1 | * | 2/2001 | Cleaver et al. | 219/390 |
| 6,563,686 B2 | * | 5/2003 | Tsai et al. | 361/234 |

* cited by examiner

*Primary Examiner*—Gregory Wilson
(74) *Attorney, Agent, or Firm*—Knobbe, Martens, Olson & Bear, LLP

(57) ABSTRACT

A pedestal for use in a high temperature vertical furnace for the processing of semiconductor wafers provides a closure and heat insulation for the lower end of the furnace and is a wafer boat support. The pedestal, comprising quartz-enveloped insulation material, supports a wafer boat at a boat support level and is provided with an upper section disposed above the boat support level. The upper section comprises enveloped insulating material. The envelope of the upper section is also formed of quartz and the insulating material in the upper section has a lower thermal conductance than the insulating material in a lower quartz enveloped section.

44 Claims, 10 Drawing Sheets

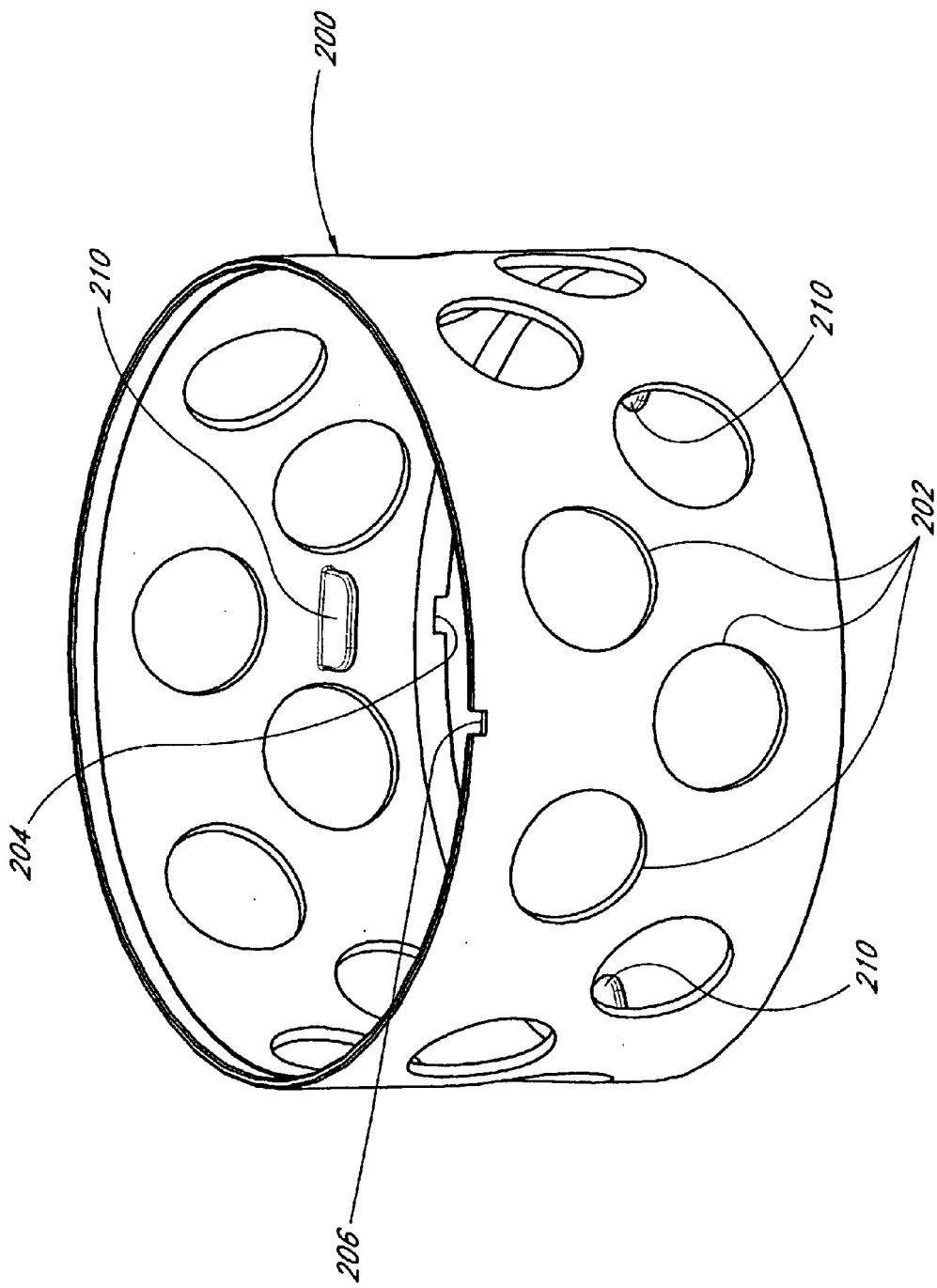

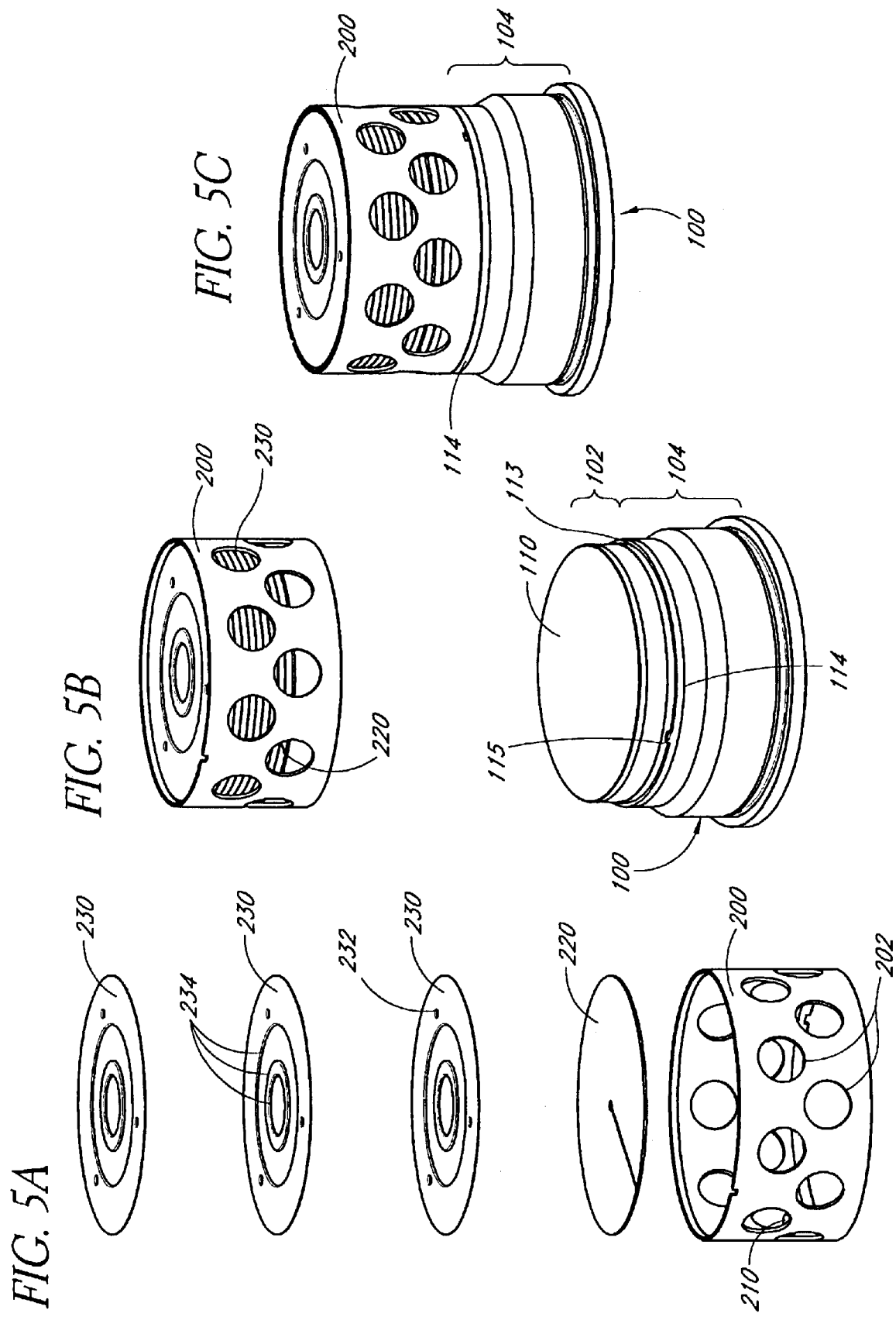

MULTILEVEL PEDESTAL FOR FURNACE

REFERENCE TO RELATED APPLICATION

This application claims the priority benefit of U.S. Provisional Application Ser. No. 60/365,129, filed Mar. 15, 2002.

FIELD OF THE INVENTION

The invention relates to vertical furnaces for the processing of semiconductor wafers and, more particularly, to a pedestal for supporting a wafer boat in the vertical furnace.

BACKGROUND OF THE INVENTION

For high temperature processing using a wafer boat in a vertical furnace, a pedestal is commonly used at a lower end of the furnace to support the wafer boat and to provide a thermal insulation plug at the bottom of the furnace. Such a pedestal typically comprises an insulating material inside a quartz envelope, with the quartz envelope supporting the wafer boat and the insulating material providing thermal insulation. Such a pedestal is described, e.g., in U.S. Pat. No. 5,601,428 to Okoshi and assigned to Shin-Etsu Quartz Products Co. In that patent, the insulating material is a quartz glass foam having an apparent density of 0.1 g/cm$^3$ to 0.8 g/cm$^3$.

In such pedestals according to the prior art, wafer boats are supported on the top surfaces of the pedestals. For very high temperature applications, however, the top surface of the quartz pedestal is still too hot and, therefore, too weak, to serve as a support surface. To reduce the temperature of the support surface, silicon carbide (SiC) heat shields or heat shields of other suitably heat resistant material can be placed above the quartz pedestal to insulate the top surface of the underlying pedestal from the high heat of the space occupied by the wafer boat. In very high temperature ranges (e.g., 1000° C. or greater), however, the heat shields can become so hot that they can act as radiation sources themselves. Therefore, their insulation value is limited and a large number of heat shields, occupying a large volume, would be required to sufficiently reduce the temperature of the top surface to make the top surface suitable for use as a wafer boat support surface.

To address the problem of a weak wafer support surface, it is also possible to make the envelope of the pedestal of SiC instead of quartz. Such a scheme has at least two disadvantages, however. First, SiC has a thermal conductivity that is so high that the insulating function of the pedestal would be essentially nullified. Second, SiC parts are more expensive to manufacture than quartz.

Accordingly, it is an object of the present invention to provide a thermally insulating, wafer boat-supporting pedestal that is compact and that is capable of use in very high temperature applications in furnaces, e.g., at temperatures of 1000° C. or greater.

SUMMARY OF THE INVENTION

In accordance with one preferred embodiment of the invention, a system is provided for semiconductor processing. The system comprises a furnace containing a wafer boat that holds a plurality of wafers. The wafer boat is configured to insert into a reaction space in the furnace for processing the plurality of wafers. The weight of the wafer boat is supported by a wafer boat support surface of a pedestal. The wafer boat support surface is insulated by an insulating material which is located above the wafer boat support surface but below the top surface of the pedestal. The insulating material is sealed from the reaction space by the walls of the pedestal.

In accordance with another embodiment, a pedestal for supporting an overlying wafer boat is provided. The pedestal comprises an envelope for insulating a lower part of a semiconductor processing furnace and an insulation material. The envelope has an upwardly facing wafer boat support surface, which is configured for directly or indirectly bearing the weight of the overlying wafer boat. The insulation material is for thermally insulating the wafer boat support surface. The isolation material is disposed at least partly above the wafer boat support surface and is sealed by the envelope from gas communication with an atmosphere above the wafer boat support surface.

In accordance with yet another preferred embodiment of the invention, a method for very high temperature semiconductor processing is provided. The method comprises providing a wafer boat containing a plurality of wafers, supporting the wafer boat on a surface of a pedestal, insulating the surface by providing a thermal insulator between the wafer boat and the wafer boat support surface, and processing the wafers at a temperature greater than about 1000° C.

BRIEF DESCRIPTION OF THE DRAWINGS

The invention will be better understood from the detailed description of the preferred embodiments and from the appended drawings, which are meant to illustrate and not to limit the invention, and wherein:

FIG. 4 is a perspective view of the support cylinder of FIG. 1;

FIGS. 5A, 5B and 5C are exploded, partially assembed and assembed perspective views, respectively, showing the support cylinder of FIG. 1 loaded with heat shields and placed atop the pedestal of FIG. 1;

DETAILED DESCRIPTION OF THE PREFERRED EMBODIMENTS

Figure 1:
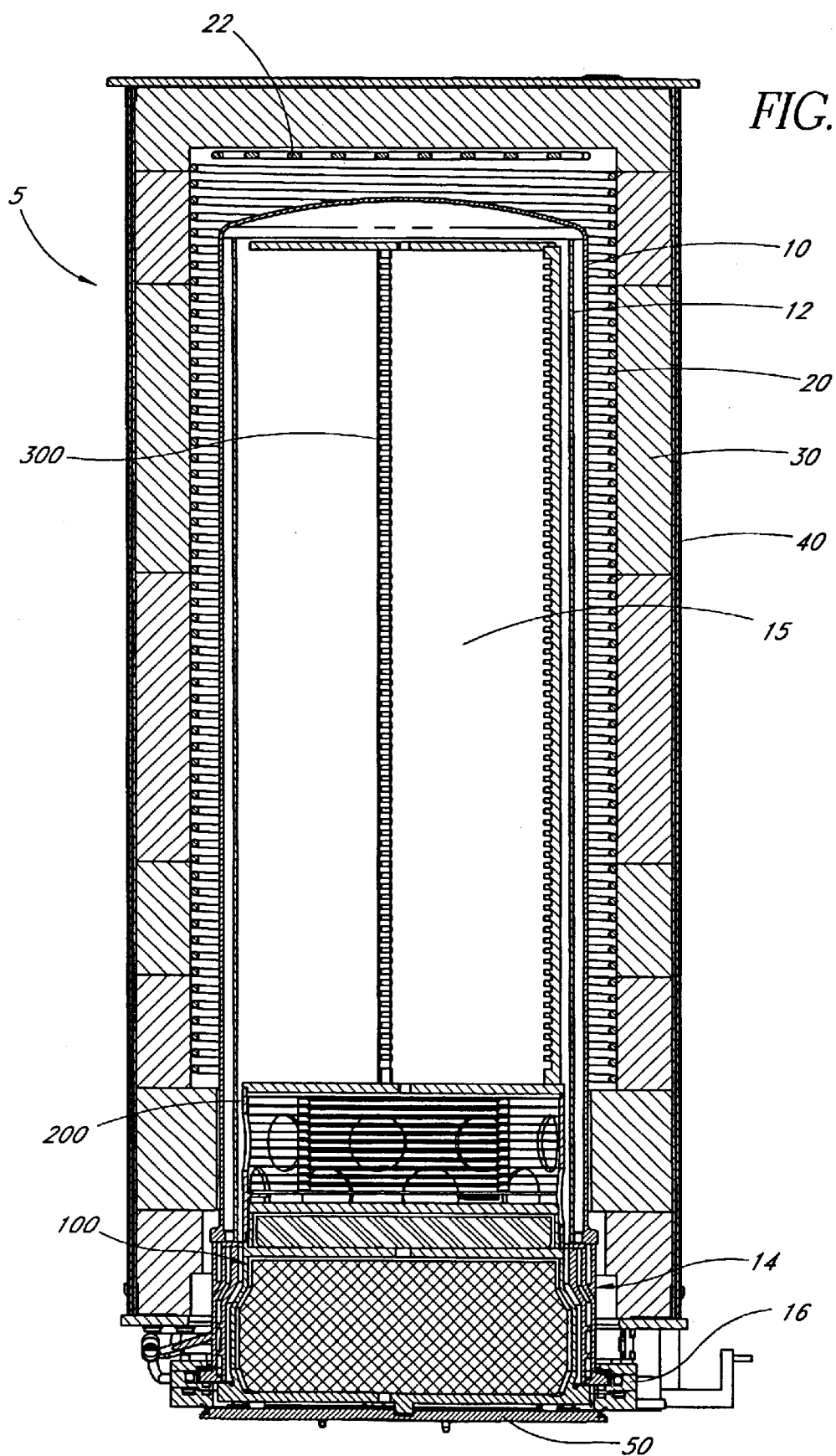
FIG. 1 is a cross-sectional side view of a furnace provided with a boat, a heat shield support cylinder and pedestal according to preferred embodiments of the invention.

According to preferred embodiments of the invention, a pedestal suitable for supporting a wafer boat in very high temperature applications is provided. In the illustrated embodiments, the pedestal acts as an envelope for insulating material and comprises an upper and a lower section, the lower section being below the upper section. The pedestal also has a wafer boat support surface at a level below the top, or topmost, surface of the pedestal, where the wafer boat support surface is configured to support an overlying wafer boat. The upper section at least partly extends above the boat support surface and preferably contains an insulating material. The insulating material thermally insulates the wafer boat support surface, thereby reducing the temperature of the surface and allowing the pedestal to be used in higher temperature applications than a pedestal without the insulation provided by the upper section. In addition to the upper section, the interior volume of the pedestal as a whole is preferably substantially filled with insulating material, so that the pedestal can serve as a thermal insulation plug to thermally insulate the bottom regions of a furnace containing the pedestal from the high temperatures in upper regions of the furnace. The upper and lower sections can be completely open to one another or can be separated by an intermediate plate.

An intermediate support structure is also provided in the illustrated embodiments. The intermediate support structure partially supports, and, more preferably, directly contacts, the overlying wafer boat and transfers the weight of that boat to the wafer support surface of the pedestal. The intermediate support structure is preferably a support cylinder. Also provided are heat shields for further insulating the wafer support surface. The heat shields can be held in a heat shield holder and are preferably placed over the top surface of the pedestal. More preferably, the heat shield holder is the intermediate support structure, e.g., the support cylinder.

According to one preferred embodiment, the upper and lower sections are not separated by an intermediate plate and comprise a single interior volume. The material forming the surfaces, or walls, of upper and lower sections is preferably a quartz material and, more preferably, an opaque quartz material, rather than a clear quartz material. With clear quartz, although thermal conductivity is relatively low, heat transport through radiation can be substantial. With opaque quartz, heat transport by radiation is effectively prevented by the opacity of the quartz. Thus, a quartz structure preferably contains the boat support surface and serves as the boat supporting structure.

In addition, the upper section is preferably designed such that it can accommodate an intermediate support structure. As shown in the illustrated embodiments, the support structure is preferably a support cylinder. Thus, to accommodate the support cylinder, the upper section can, for example, have a smaller diameter than either the support cylinder or lower section, in which case the support cylinder can fit around the upper section while both it and the upper section are resting on the lower section. To support the overlying wafer boat, the support cylinder preferably extends above the upper section so that the overlying wafer boat can contact it. As discussed in greater detail below, the support cylinder is preferably formed of SiC and preferably has a plurality of cut outs, e.g., through holes, in its walls in order to minimize heat transport through the cylinder.

In another preferred embodiment, the top and lower sections of the pedestal differ from the previously discussed embodiment in that these sections are separated by an intermediate plate, forming two separate envelopes, each envelope containing insulating material. The lower section is preferably a conventional pedestal and, as such, the lower section envelope is preferably formed of quartz. The upper section can also be formed of quartz or another heat resistant material. As discussed above, the upper section preferably thermally insulates the boat support surface of the lower section. In addition, at least one opening, e.g., a plurality of holes, in the intermediate plate and in the bottom of the lower section are preferably provided to allow gas communication between the upper section and lower section and between the lower section and the ambient atmosphere below the bottom of the lower section.

In preferred embodiments, the interiors of the upper and the lower sections of the pedestal are preferably filled with insulating material having low thermal conductivity such as, e.g., a quartz glass foam or other materials known in the art. Because open pores typically comprise a high fraction of the volume of these materials, such that exposing them to process gases is undesirable, the insulating material is preferably sealed from process gases by the upper and lower sections, which effectively serve as envelopes for these materials.

By such an arrangement, a steep thermal gradient can be created where heat loss in the process space of the furnace is limited and does not detrimentally affect the temperature uniformity of that space. Moreover, because of the thermal gradient created in the pedestal, particularly because of a steep gradient in the upper section of the pedestal, the temperature at the level of the boat support surface is sufficiently low that the quartz is mechanically stable enough to carry the weight of a boat loaded with wafers during high temperature processing. Typically, the boat is designed to hold more than 50 and, more preferably, more than 70 wafers. In another embodiment, discussed below, on top of the pedestal, but below the wafer boat, heat shields are preferably also provided to further lower the temperature of the wafer support surface.

In accordance with another aspect of the invention, the upper section of the pedestal is filled with an insulation material with a particularly low thermal conductivity, preferably lower that the thermal conductivity of the insulation material in the lower section of the pedestal. In this way, at steady state, a non-linear thermal gradient will exist over the pedestal, with the steepest gradient and the largest drop in temperature over the highly insulating upper section. The higher thermal conductivity of the insulating material in the lower section of the pedestal allows the heat to be transferred away from the boat support surface of the pedestal, thereby cooling that surface, while the highly insulating material in the upper section of the pedestal minimizes heat transmission to lower parts of the furnace, limiting the heat loss from the reaction space.

In another preferred embodiment, directly on top of the pedestal is a SiC heat shield holder. The heat shield holder preferably sits directly atop the pedestal and holds a plurality of heat shields. The heat shields are stacked on top of a heat shield support plate, positioned above the top surface of the quartz pedestal, to provide for extra thermal insulation for the wafer boat support surface.

Preferably, the heat shield holder is an intermediate support structure, such as the illustrated support cylinder. As such, the heat shields can be held in the support cylinder over the top surface of the pedestal while the support cylinder transfers the weight of the wafer boat to the wafer boat support surface of the pedestal. As such, the heat shield holder is preferably formed by a support cylinder that extends sufficiently high above the top surface of the pedestal so that a number of heat shields can be stacked inside the support cylinder. The cylinder is used to support a wafer boat on its top surface and extends downwardly to the boat support surface of the pedestal. A SiC boat can be placed on top of the support cylinder and is thus indirectly supported, via the support cylinder, on the pedestal's boat support surface. The support cylinder is made of a material that can withstand very high temperatures, such as, preferably, SiC. In the case of a support cylinder formed from SiC, the relatively high thermal conductivity of SiC will allow some extra heat transport, relative to a quartz support cylinder, to be conducted to the boat support surface of the pedestal. This heat transport is limited in the preferred embodiments, however, by providing the support cylinder with a number of through holes in the walls of the cylinder.

Accordingly, by partly separating the insulation function and the support function of the quartz pedestal, a quartz pedestal can advantageously be used at higher temperatures than conventionally possible. For example, the pedestal can preferably be used to support wafer boats during semiconductor fabrication processes at temperatures that are preferably 1000° C. or greater, more preferably, 1200° C. or greater and, most preferably, 1300° C. or greater. Moreover, a steeper temperature gradient allows for a more compact pedestal and a shorter overall furnace height. In addition, by using different insulating materials, with the least thermally conductive insulating material in upper parts of the pedestal, these advantages can be maximized.

Reference will now be made to the Figures, wherein like numerals refer to like parts throughout.

FIG. 1 shows a furnace 5 provided with a pedestal 100 according to preferred embodiments of the invention. The lower section of the furnace 5 is shown in more detail in FIG. 2. A process tube 10 and an inner tube 12 are supported by a support sleeve 14, which is in turn supported by flanges 16. A suitable support sleeve is disclosed in U.S. Provisional Application Ser. No. 60/365,354, filed Mar. 15, 2002, the disclosure of which is incorporated herein by reference in its entirety. The cylindrical process tube 10 is surrounded by a cylindrical heating coil 20, a top heating coil 22, an insulation material 30 and an outer shell 40. A doorplate 50 supports a pedestal 100, a support cylinder 200 and a wafer boat 300. The pedestal 100, the support cylinder 200 and the wafer boat 300 can be inserted and removed from the furnace 5 with the aid of an elevation mechanism (not shown). The wafer boat 300 protrudes into the reaction space 15, i.e., the volume inside the furnace 5 in which process gases can interact with wafers (not shown) during semiconductor fabrication processes. It will be appreciated that in the illustrated furnace 5, the process tube 10, the inner tube 12, the support sleeve 14 and the pedestal 100 together delimit the reaction space 15.

A cross section of the pedestal 100 according to one preferred embodiment of the invention is shown in FIGS. 3A–3D. The pedestal 100 comprises an upper section 102 and a lower section 104. The overall quartz envelope of the pedestal 100 comprises a top plate 110, an upper sidewall 112, an intermediate plate 114 (FIGS. 3A–3C), a lower sidewall 116 and a bottom plate 118. It will be appreciated that the intermediate plate 114 divides the overall quartz envelope of the pedestal 100 into two subsections, or small envelopes, which are illustrated as the upper section 102 and lower section 104. The bottom plate 118 is preferably provided with a flange 120 to seal against a lower surface of the support sleeve 14, shown in FIGS. 1 and 2, and with legs 122 for interacting with the doorplate 50. An upper insulation body 130 is provided in the upper section 102, while a lower insulation body 132 is provided in the lower section 104.

The intermediate plate 114 is preferably provided with an upper bleeding hole 117, to discharge, upon heating of the pedestal 100, expanding gas present in the upper section 102 into the lower section 104. Similarly, the bottom plate 118 is preferably provided with a lower bleeding hole 119, to discharge expanding gas present in the lower section 104 into the area below the bottom plate 118. Accordingly, expanding gas inside the pedestal can easily discharge into a region outside the reaction space 15 via the bleeding holes 117 and 119. The upper section 102, the lower section 104 and the bottom plate 120 (which seals against the support sleeve 14) are preferably permanently connected with each other, such that the upper insulation body 130 and the lower insulation body 132 are sealed from the atmosphere of the reaction space 15 (FIG. 1). By directing gas expansion from the heated interior of the pedestal 100 to beneath the lower surface of the pedestal, which is sealed from the reaction space 15, possible contamination of process ambient of the reaction space 15 is avoided.

It will be appreciated that while the bleeding holes 117 and 119 are shown at particular positions in the intermediate plate 114 and the bottom plate 118, respectively, these positions are for ease of illustration only; the bleeding holes 117 and 119 may be at any position in the intermediate plate 114 and the bottom plate 118. For example, both bleeding holes 117 and 119 can be placed at the centers of the intermediate plate 114 and the bottom plate 118, respectively. Moreover, it will be appreciated that bleeding hole 117 can comprise more than one opening, as can bleeding hole 119.

Still with reference to FIGS. 3A–3D, in one preferred embodiment, a support cylinder 200, described in greater detail below with respect to FIG. 4, is supported on the peripheral, unobstructed part 113 of intermediate plate 114, which is preferably provided with an orientation fixation cam 115. Accordingly, in the illustrated embodiment, the intermediate plate 114, or at least the extreme peripheral edges 113 thereof, serves as the boat support surface of the pedestal, with the support cylinder 200 (FIG. 5) transferring the weight of an overlying wafer boat 300 (FIG. 5) to the boat support surface 113. It will be appreciated, however, that other unobstructed surfaces can provide the boat support surface of the pedestal 100 in other arrangements.

Figure 3A:
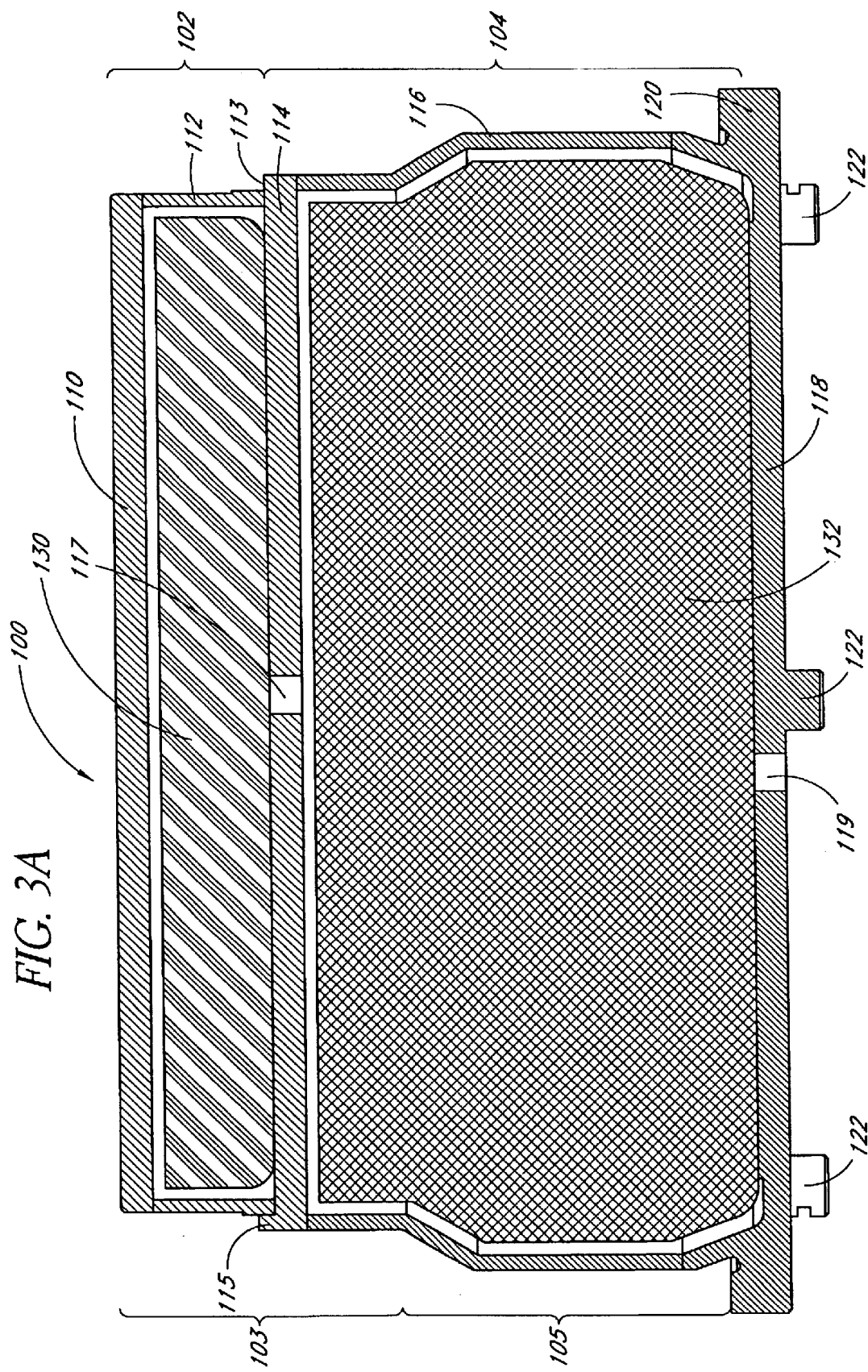
FIGS. 3A, 3B, 3C and 3D are cross-sectional side views of the pedestal of FIG. 1, showing various spatial relationships between the wafer boat support surface and the upper and lower sections of the pedestal.
Figure 3B:
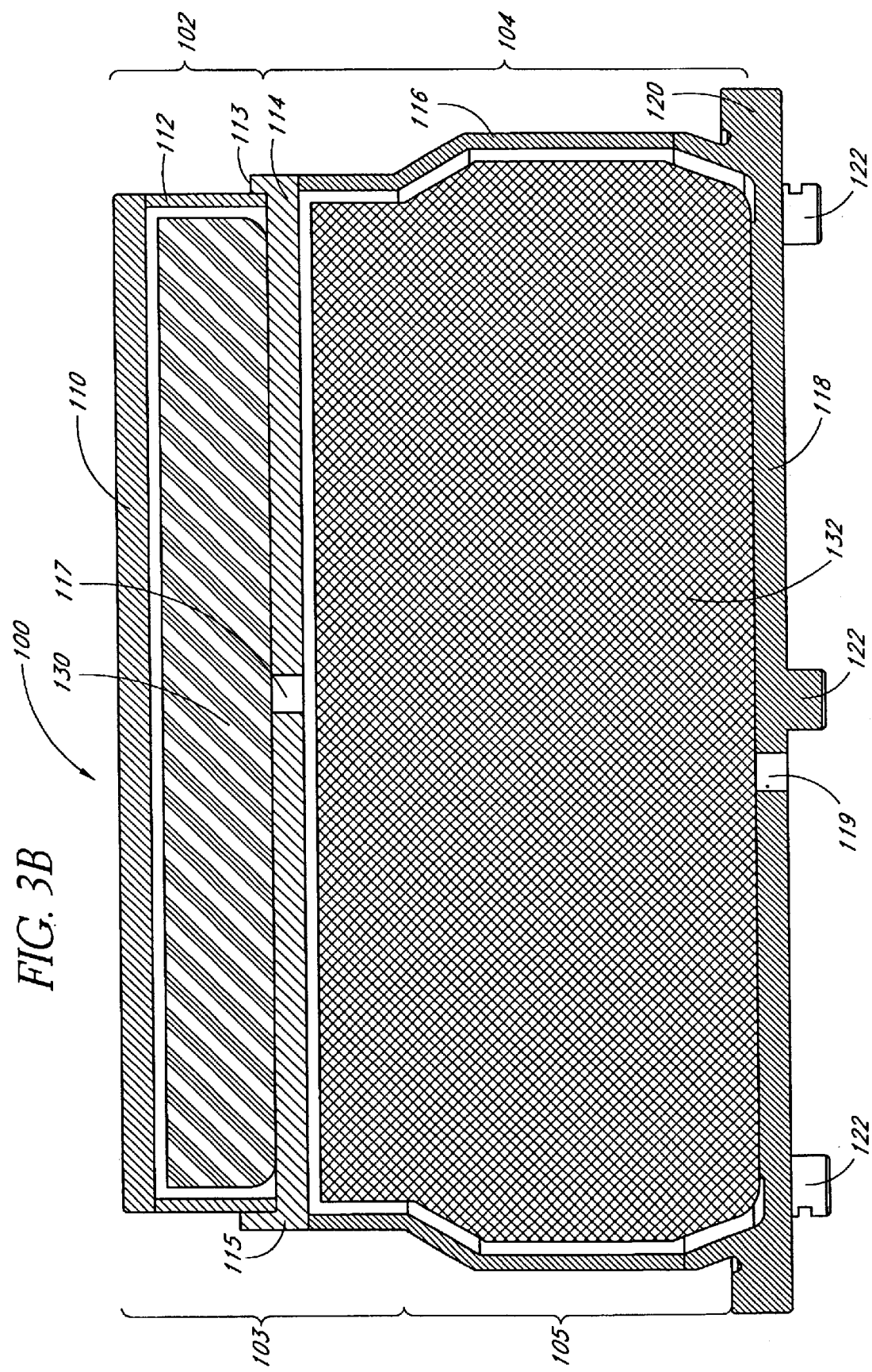
Figure 3C:
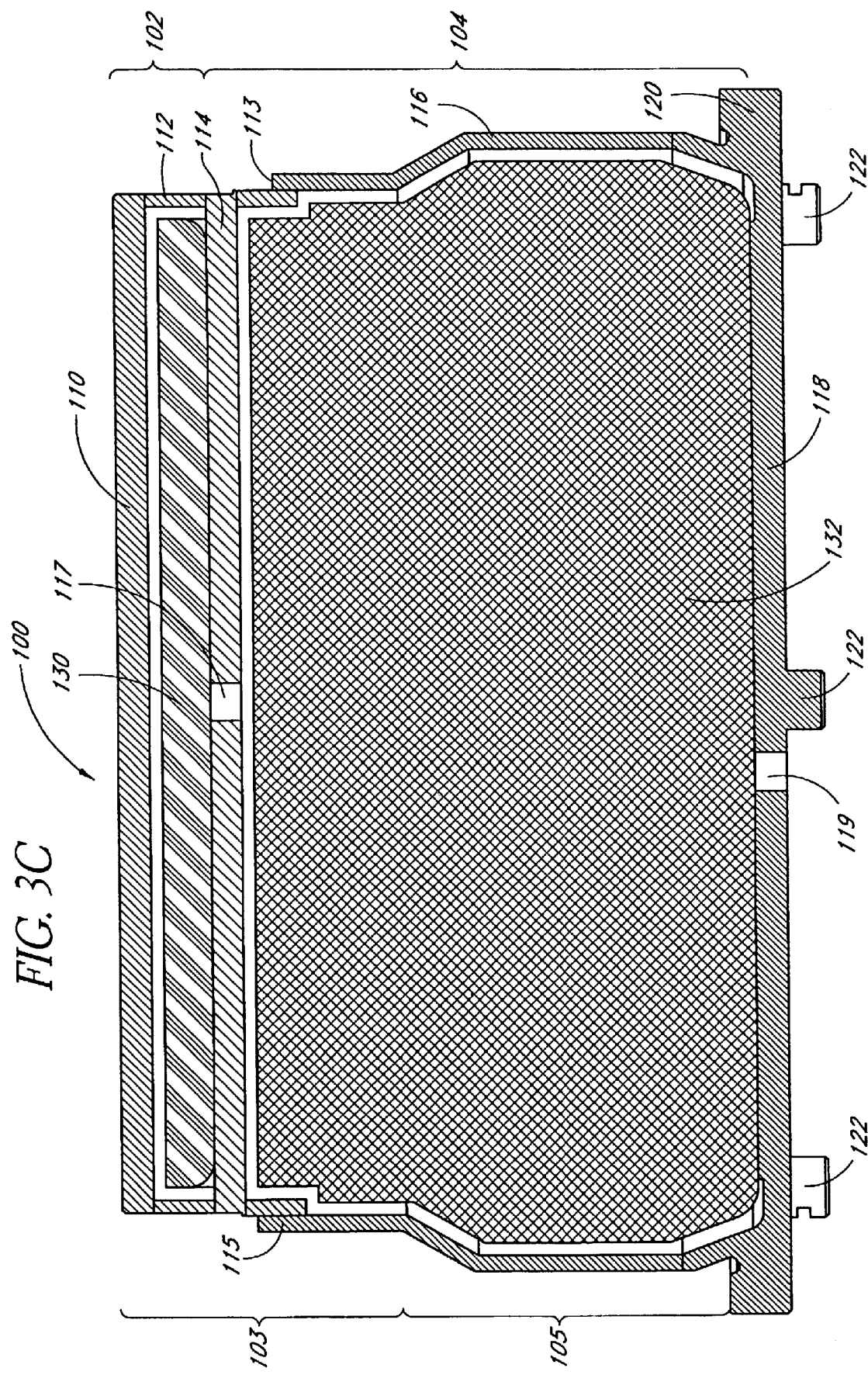
Figure 3D:
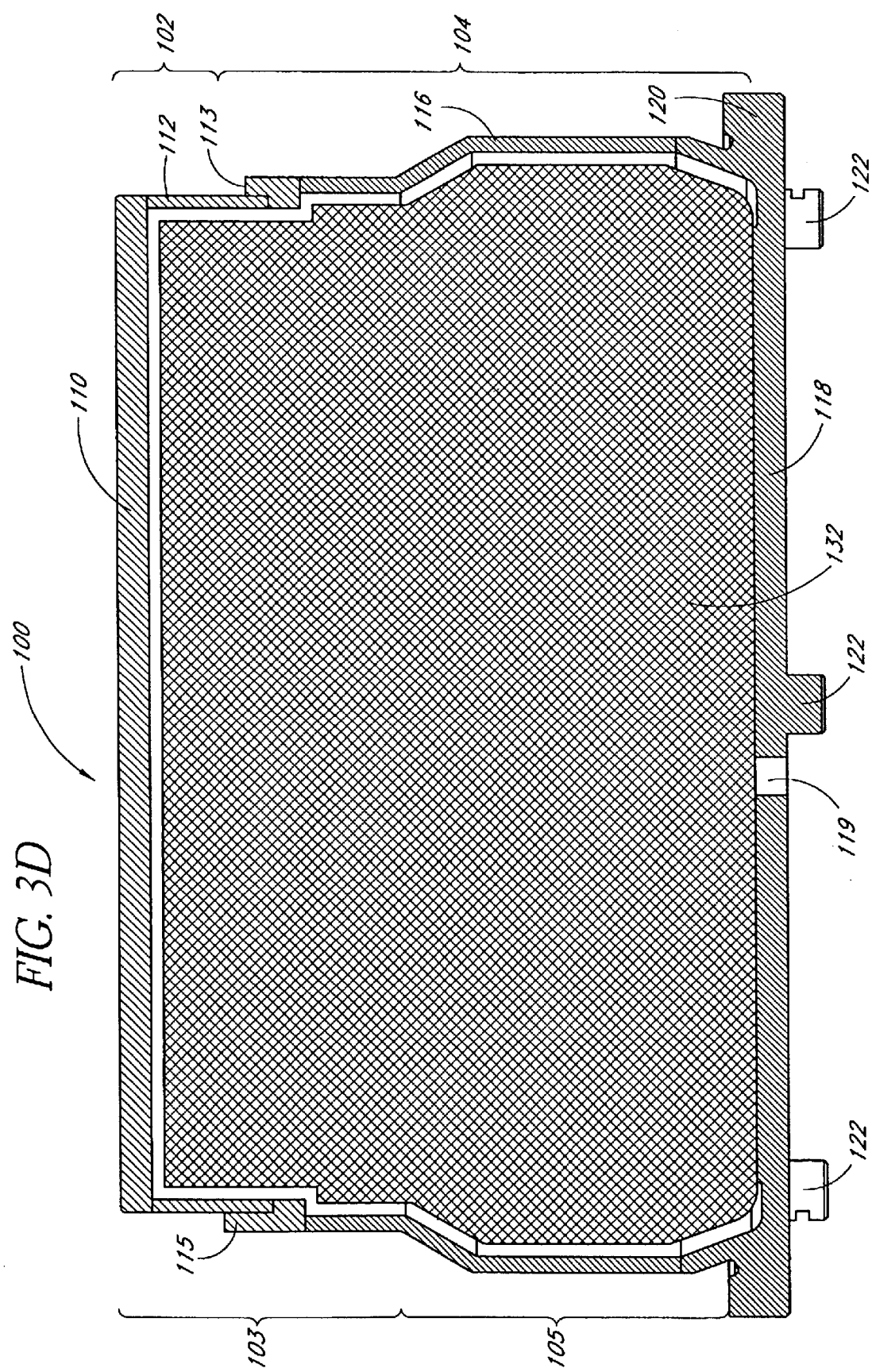

Preferably, the pedestal 100 includes a material of high thermal insulation in the upper insulation body 130 either extending above or (as illustrated in FIG. 3A) exclusively above the boat support surface 113, as well as a less insulating material in the lower insulation body 132 extending below or (as illustrated in FIG. 3A) exclusively below the boat supporting surface 113. In other embodiments, however, it will be appreciated that the upper insulation body 130 can partly extend below the boat supporting surface 113, as shown in FIG. 3B, or the lower insulation body 132 can extend partly above the boat supporting surface 113, as shown in FIG. 3C. In FIG. 3D, the pedestal 100 does not have an intermediate plate. Rather, the wafer boat support surface 113 is simply a laterally extending surface of the wall of the pedestal 100. Furthermore, the pedestal of FIG. 3D is filled by only a single insulation body 132.

An intermediate support structure, in the form of the support cylinder 200 is shown in FIG. 4 and is preferably provided with openings shown in the form of circular holes 202. The circular holes 202 have two purposes: first, to prevent forming a dead volume inside the cylinder 200; and second, to reduce heat conduction through the cylinder. By not making the holes 202 unduly large, these goals are advantageously achieved without seriously affecting the strength of the cylinder 200. The cylinder 200 is provided at its inside with three supports 210, which can support a heat shield (not shown), as discussed below with respect to FIGS. 5A–5C. At its bottom end, the cylinder 200 is provided with a lower orientation notch 204, for mating with the orientation ridge or cam 115 of the pedestal 100 (see FIG. 3) to ensure a fixed orientation of the cylinder 200 on top of the pedestal 100. At its upper end, the cylinder 200 is provided with an upper orientation notch 206, for mating with an orientation cam of the wafer boat 300 to ensure a fixed orientation of the wafer boat 300 on the cylinder 200.

FIGS. 5A, 5B and 5C show the placement of a plurality of heat shields 230 on top of the pedestal 100. FIG. 5A shows the support cylinder 200, provided with the large circular holes 202 and with the three supports 210 (one is visible) to support a base plate 220. The heat shields 230 are provided with raised parts 232 to facilitate closely spaced stacking of the heat shields 230. The heat shields 230 are not completely flat but comprise a few annular ripples 234 to improve their strength. FIG. 5B shows the support cylinder 200, containing the base plate 220 and the heat shields 230, ready to be placed on top of the pedestal 100. FIG. 5C shows the parts in an assembled state. The support cylinder 200 rests upon the boat support surface 114 of the pedestal 100, such that the cylinder 200 is now ready to receive a boat 300 (FIG. 6).

Figure 6:
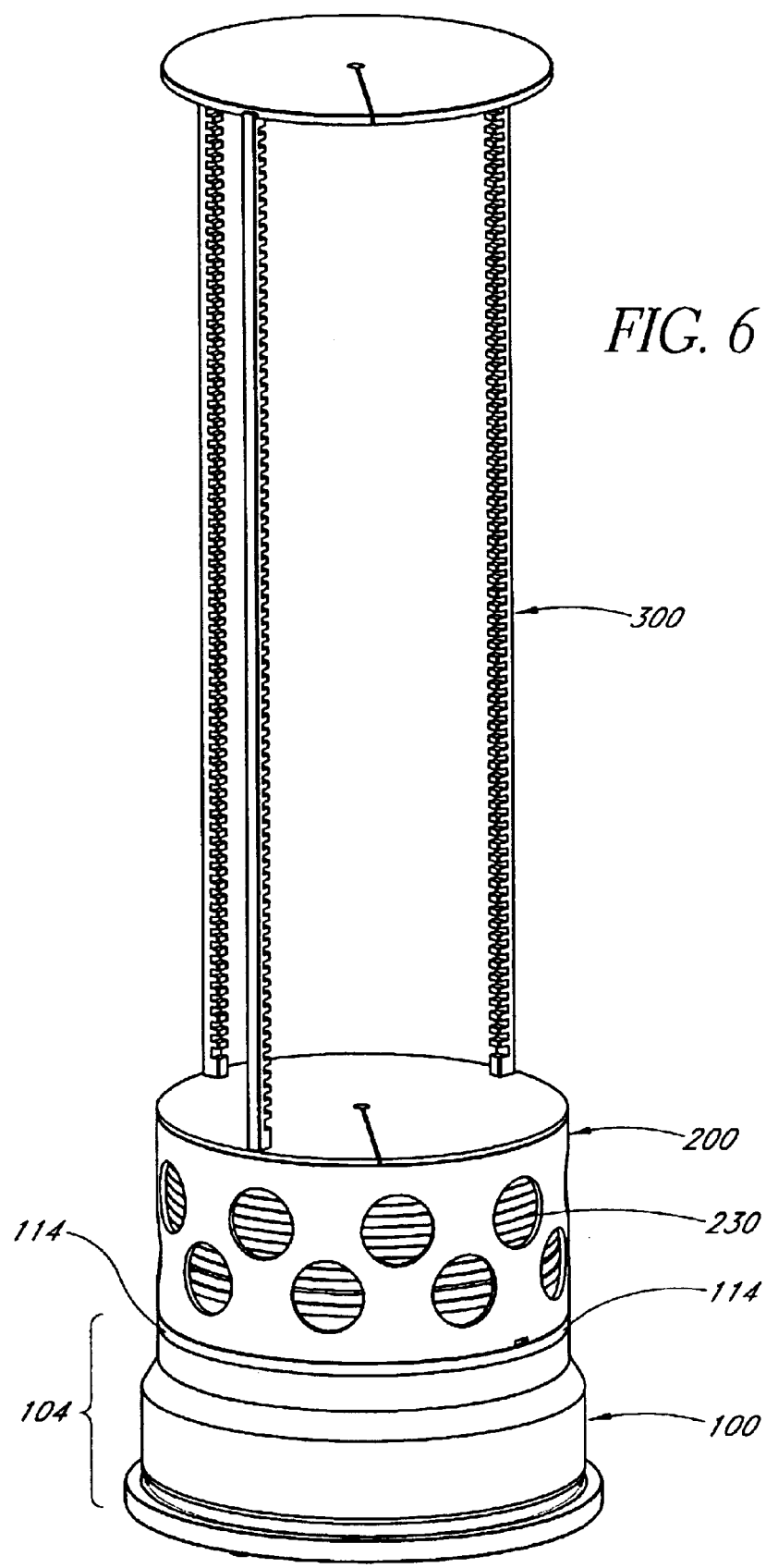
FIG. 6 is a perspective view showing the assembled pedestal, support cylinder and wafer boat of FIG. 1.

FIG. 6 gives another view of the pedestal 100, together with the support cylinder 200 and heat shields 230, in an assembled state. Also shown is the wafer boat 300 placed on top of the support cylinder 200.

Referring back to FIGS. 2 and 3A, an upper portion 103 of the pedestal 100, including the upper section 102 and a top part of the lower section 104, has an outer diameter which is sufficiently smaller than the inner diameter of the inner process tube 12 (FIG. 1) so that the upper portion 103 can be accommodated inside the inner tube 12 with some clearance. A lower portion 105 of pedestal 100, however, preferably has a larger outer diameter than the upper portion 103. Preferably, this diameter is also larger than the inner diameter of the inner tube 12. In this way, heat transport by radiation along direct lines of sight from the hotter regions of the reaction space 15 (FIG. 1) containing the wafer boat 300 is prevented because the direct line of sight is broken. In order to accommodate the larger diameter portion 105 of the pedestal 100, the diameter of a corresponding portion of the support sleeve 14 is also increased. As discussed above, a suitable support sleeve is disclosed in U.S. Provisional Application Ser. No. 60/365,354, filed Mar. 15, 2002, the disclosure of which is herein incorporated by reference in its entirety.

Figure 2:
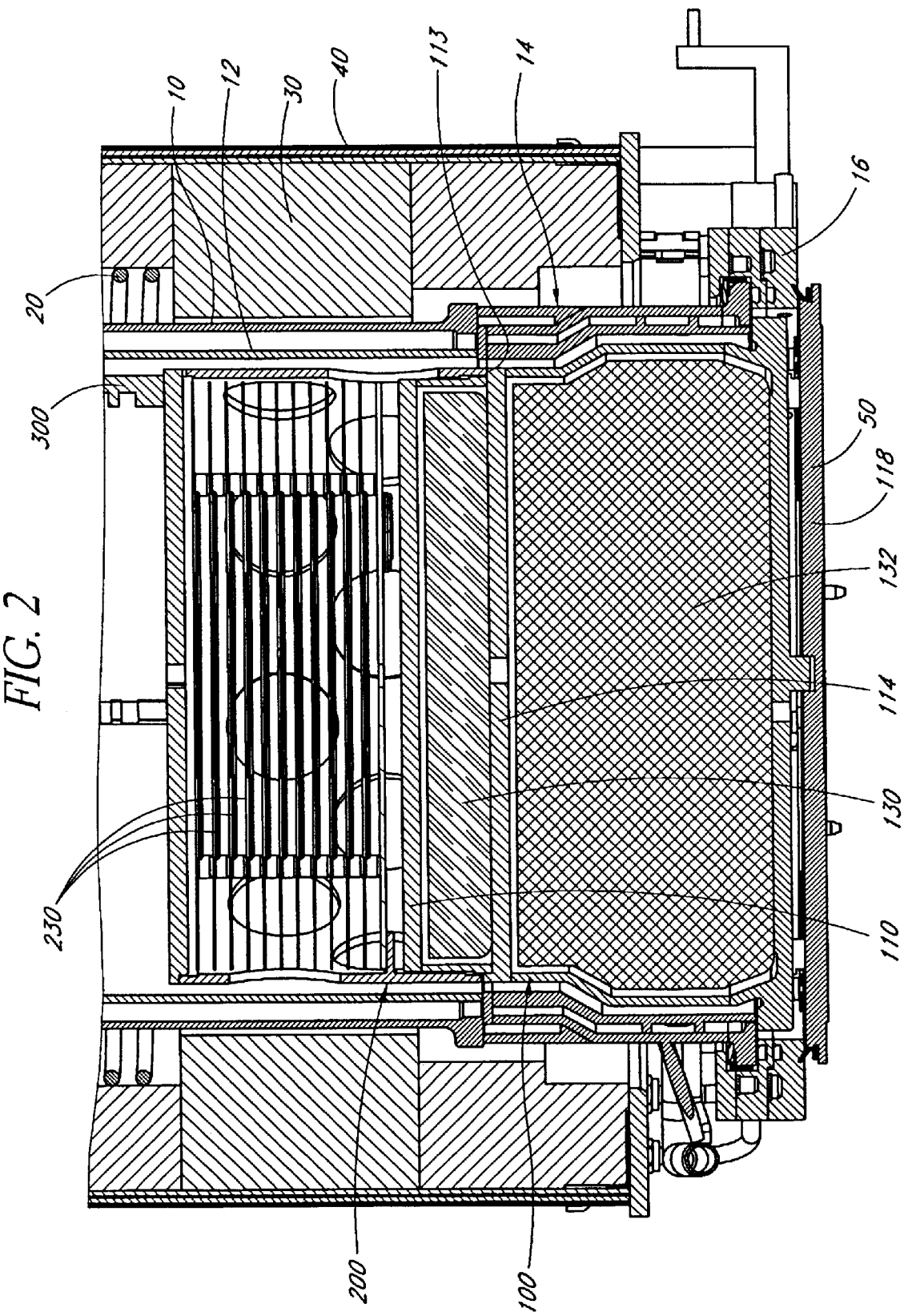
FIG. 2 is an enlargement of a lower section of FIG. 1.

Another advantageous feature of the preferred embodiments is illustrated in FIG. 2. The bottom end of the wafer boat 300 preferably practically coincides with the last winding of the heating coil 20. The space between the lower surface of boat 300 and the upper surface of the pedestal 100 is completely filled with the stack of closely spaced heat shields 230. By placing the top of the heat shields 230 nearly immediately below the heat coil 20, insulation of the bottom regions of the furnace 5 begins almost immediately below the level of the heat coil 20, resulting in a very compact bottom region of the furnace 5. Consequently, the part of the furnace 5 extending below the heating coil 20 and necessary for insulation purposes can be kept very short while still providing adequate insulation.

Figure 7:
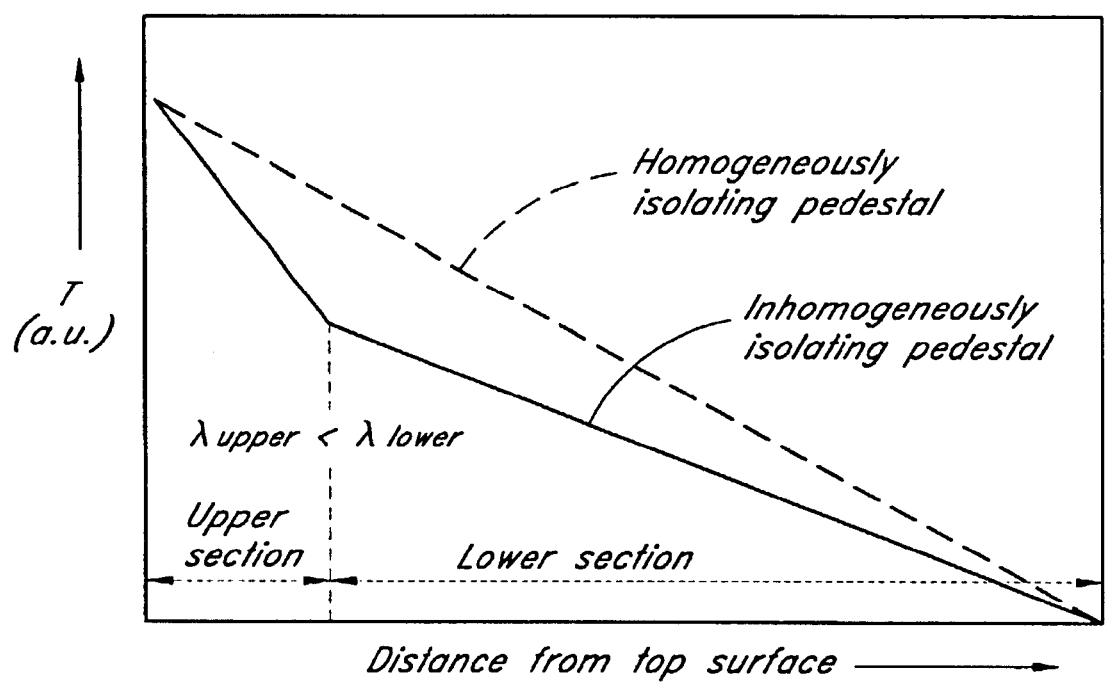
FIG. 7 is a graphical representation of the temperatures in the pedestal of FIG. 1 as a function of distance from the top surface, with the pedestal filled with either homogeneous or inhomogeneous insulation material.

In one preferred embodiment, the insulation body 130 in the upper section 102 of the pedestal 100 is made of a material with a lower thermal conductance than the material of the insulation body 132 in the lower section 104. The effect of this is illustrated in FIG. 7. For a homogeneous body of insulating material, a linear temperature gradient will establish itself at steady state and the heat flux through the body will be the same for every cross section of the pedestal perpendicular to the direction of heat flow. Changing the thermal conductivity of the insulating material in a homogeneous way will only change the heat flux but not the linear gradient; a lower thermal conductivity will result in a lower heat flux. However, if the thermal conductivity $\lambda_{upper}$ in the upper part of the insulation body is smaller than the thermal conductivity $\lambda_{lower}$ in the lower part of the insulation body, a non-linear temperature gradient will arise. Also, in this case at steady state, the heat flux through every horizontal plane will be the same. For a material with a lower thermal conductivity, a steeper temperature gradient is required to facilitate the same heat flux. Therefore, in the upper section 102 of the pedestal 100 a steeper gradient will be present than in the lower section 104. This is helpful in achieving, at the boat support surface 113 of the pedestal 100, a temperature that is sufficiently low so that the quartz envelope can carry the weight of the wafer boat 300. The higher thermal conductivity of the insulation material in the lower section 104 of the pedestal facilitates the transport of heat away from the boat support surface.

Although in illustrated embodiments the upper section 102 and the lower section 104 form a common quartz envelope, other variations are possible in other embodiments. For example, it is possible to use a pedestal with an upper section that is removably placed on top of the lower section. Furthermore, it is possible that the envelope of the upper section is formed of a material other than quartz. For example, the envelope of the upper section can be made of SiC, for example, just as the support cylinder. In such an embodiment, there is no longer a need for the SiC support cylinder that holds the radiation heat shields to extend downwardly to the boat support surface. Instead, the cylinder can be placed on top of the SiC upper section, the SiC upper section transferring the weight of the boat to a boat support surface of the lower section of the pedestal. In this case, the boat support surface is simply the upper surface of the lower section at which the upper section envelope interfaces with the lower section.

Although the illustrated preferred embodiments are shown with particular features, it will be clear that the present teachings do not require that embodiments of the invention possess all the illustrated features. It is, for example, possible for the intermediate support structure to be a support table, comprising support legs, rather than the illustrated cylinder. In that case, the upper section of the pedestal is preferably provided with cutaways, or holes, to allow the support legs to extend down to the boat support surface of the pedestal. Preferably, the support legs and cutaways are provided near the perimeter of the pedestal. Furthermore, although FIGS. 3A–3C contain the intermediate plate 114 and are relatively easy to manufacture with this intermediate plate, in alternative embodiments the upper section and lower section of the pedestal do not form two separate chambers, as illustrated by the embodiment of FIG. 3D (in this case having a single insulation material 132 filling the quartz envelope). In another alternative embodiment, the bottom plate 118, sealing against the support sleeve, is not an integral part of the pedestal. A separate bottom plate, sealing against the support sleeve, can be provided. In this embodiment, the pedestal can be disposed on top of this separate bottom plate.

Similarly, various other modifications, omissions and additions may be made to the methods and structures described above without departing from the scope of the invention. All such modifications and changes are intended to fall within the scope of the invention, as defined by the appended claims.

We claim:

1. A system for semiconductor processing, comprising:

a plurality of wafers;

a furnace, the furnace containing a reaction space for processing the plurality of wafers;

a wafer boat, the wafer boat configured to insert into the reaction space and hold the plurality of wafers;

a pedestal, the pedestal having a top surface and a wafer boat support surface, the wafer boat support surface supporting a weight of the wafer boat and being below the top surface; and an insulating material, the insulating material disposed both above and below the wafer boat support surface, the insulating material being sealed from the reaction space by walls defining the pedestal.

2. The system of claim 1, wherein the furnace is a very high temperature furnace configured for conducting semiconductor fabrication processes at a temperature greater than about 1000° C.

3. The system of claim 2, wherein the temperature is greater than about 1200° C.

4. The system of claim 1, wherein the walls comprise a heat resistant material.

5. The system of claim 4, wherein the heat resistant material comprises quartz.

6. The system of claim 4, wherein the quartz comprises opaque quartz.

7. The system of claim 1, wherein an inner tube partly delimits the reaction space, wherein the inner tube has an inner tube diameter, wherein an upper diameter of an upper part of the pedestal is smaller than the inner tube diameter.

8. The system of claim 7, wherein a lower diameter of a lower part of the pedestal is larger than the inner tube diameter.

9. The system of claim 7 wherein a support sleeve supports the inner tube, wherein the support sleeve forms a seal with a bottom plate of the pedestal.

10. The system of claim 7, wherein the wafer boat support surface extends outwardly beyond the upper diameter of the upper part of the pedestal.

11. The system of claim 1, wherein an intermediate support structure sits directly upon the boat support surface and the wafer boat sits directly upon a top intermediate support surface.

12. The system of claim 11, wherein the intermediate support structure comprises a support cylinder.

13. The system of claim 12, wherein an interior of the support cylinder comprises a plurality of heat shields.

14. The system of claim 1, wherein the insulating material comprises two or more different insulating materials, wherein a first insulating material is disposed above the wafer boat support surface and a second insulating material is disposed below the wafer boat support surface.

15. A pedestal for insulating a lower part of a semiconductor processing furnace and for supporting an overlying wafer boat, comprising:

an envelope having a side wall, a top wall and a bottom wall, the side wall of the envelope defining an upwardly facing wafer boat support surface configured for directly or indirectly bearing a weight of the overlying wafer boat; and an insulation material disposed within the envelope for thermally insulating the wafer boat support surface and the lower part of the furnace, the insulation material disposed both below and above the wafer boat support surface and sealed by the envelope from gas communication with an atmosphere above the wafer boat support surface.

16. The pedestal of claim 15, wherein the insulation material comprises a single material substantially occupying an interior of the pedestal.

17. The pedestal of claim 15, wherein the pedestal has an upper section and a lower section, wherein the upper section has an upper section diameter and the lower section has a lower section diameter, wherein the lower section diameter is greater than the upper section diameter.

18. The pedestal of claim 17, wherein the boat support surface extends laterally beyond the upper section diameter.

19. The pedestal of claim 15, wherein the insulation material comprises a first insulation material disposed in an upper section of the pedestal and a second insulation material disposed in a lower section of the pedestal.

20. The pedestal of claim 19, wherein the upper and lower sections of the pedestal are surrounded by a common, integral envelope.

21. The pedestal of claim 19, wherein the first insulation material has a lower thermal conductance than the second insulation material.

22. The pedestal of claim 19, wherein an intermediate plate separates the upper section and the lower section.

23. The pedestal of claim 22, wherein the intermediate plate is below the boat support surface.

24. The pedestal of claim 22, wherein the upper section and the lower section are permanently joined.

25. The pedestal of claim 22, wherein the intermediate plate is provided with at least one upper section opening for communicating gases between an upper section interior and an lower section interior.

26. The pedestal of claim 25, wherein a bottom surface of the envelope is provided with at least one lower section opening for communicating gases between the lower section interior and a lower ambient atmosphere under the bottom surface.

27. The pedestal of claim 22, wherein lower section surfaces defining the lower section comprise quartz material and upper section surfaces defining the upper section comprise a heat resistant material.

28. The pedestal of claim 27, wherein the heat resistant material comprises quartz.

29. The pedestal of claim 28, wherein the heat resistant material comprises opaque quartz.

30. The pedestal of claim 27, wherein the heat resistant material comprises silicon carbide.

31. The pedestal of claim 30, wherein the boat support surface is located at a peripheral edge of the intermediate plate.

32. The pedestal of claim 15, configured to receive an intermediate support structure configured to receive the overlying wafer boat, wherein the intermediate support structure sits atop the boat support surface, the intermediate support structure extending higher than a top surface of the pedestal.

33. The pedestal of claim 32, wherein the intermediate support structure is a circular support cylinder.

34. The pedestal of claim 32, wherein the support cylinder comprises silicon carbide.

35. The pedestal of claim 34, wherein a wall defining sides of the support cylinder comprises a plurality of circular holes.

36. The pedestal of claim 34, wherein a plurality of heat shields is disposed in an interior of the support cylinder, each of the heat shields comprising a circular plate.

37. The pedestal of claim 36, wherein each of the heat shields comprises silicon carbide.

38. The pedestal of claim 37, wherein a lower heat shield of the plurality of heat shields supports an upper heat shield of the plurality of heat shields, the upper heat shield situated directly above the lower heat shield.

39. The pedestal of claim 15, wherein a shape of a top view of the pedestal is circular.

40. The pedestal of claim 15, wherein the boat support surface is on a single plane.

41. A method for very high temperature semiconductor processing, comprising:
- providing a wafer boat, the wafer boat containing a plurality of wafers;
- supporting the wafer boat on a wafer boat support surface of a pedestal, the wafer boat support surface being disposed between an upper end and a lower end of the pedestal;
- insulating the wafer boat support surface and the lower end of the furnace by providing a thermal insulator both above and below the wafer boat support surface, the thermal insulator substantially enveloped by the pedestal; and
- processing the wafers at a temperature greater than about 1000° C.

42. The method of claim 41, wherein supporting comprises sitting the wafer boat on a surface of an intermediate support structure and transferring a weight of the wafer boat to the wafer boat support surface of the pedestal.

43. The method of claim 42, wherein processing is performed at greater than about 1200° C.

44. The method of claim 43, wherein processing is performed at greater than about 1300° C.

* * * * *